United States Patent [19]

Herting et al.

[11] 4,191,570

[45] Mar. 4, 1980

[54] PROCESS FOR HEAT TREATING LITHOGRAPHIC PRINTING PLATES

[75] Inventors: Hans-Peter Herting, Osterode; Wolfgang J. Rebner, Herzberg, both of Fed. Rep. of Germany

[73] Assignee: Polychrome Corporation, Yonkers, N.Y.

[21] Appl. No.: 949,835

[22] Filed: Oct. 10, 1978

[51] Int. Cl.² .............................................. G03F 7/02
[52] U.S. Cl. ................................. 430/302; 428/195; 428/209; 428/308
[58] Field of Search ................. 96/33, 49; 428/195, 428/209

[56] References Cited

U.S. PATENT DOCUMENTS

| | | | |
|---|---|---|---|
| 2,802,845 | 8/1957 | Sadler | 260/413 |
| 4,062,682 | 12/1977 | Laridon et al. | 96/33 |
| 4,063,507 | 12/1977 | Toyama et al. | 96/33 |
| 4,101,322 | 7/1978 | Lawson | 96/33 |

FOREIGN PATENT DOCUMENTS

| | | | |
|---|---|---|---|
| 1151199 | 5/1969 | United Kingdom | 96/33 |
| 1154749 | 6/1969 | United Kingdom | 96/33 |

*Primary Examiner*—Won H. Louie, Jr.

[57] ABSTRACT

A process for producing a planographic printing plate comprising subjecting a light sensitive planographic printing plate member to a burning in wherein the light sensitive planographic printing plate member is treated with an aqueous solution of the reaction product of naphthalene, formaldehyde, and sulfuric acid prior to such burning in treatment.

10 Claims, No Drawings

PROCESS FOR HEAT TREATING LITHOGRAPHIC PRINTING PLATES

BACKGROUND OF THE INVENTION

The present invention relates to a process for producing planographic printing plates, more particularly, to a treatment for use in producing planographic printing plates comprising subjecting light sensitive planographic printing plate members with metal as a support to a burning-in.

Planographic printing is a printing method utilizing the property that water and oil will not substantially mix. The surface of a printing plate consists of areas which will receive water and repel greasy ink and areas which will repel water and receive greasy ink. The former areas are non-image areas and the latter areas are image areas. Light sensitive compositions, therefore, used in planographic printing members are required to have the property that after image formation they will repel water and receive greasy ink.

Light sensitive compositions used in planographic printing plate members are divided into positive types and negative types, and, as positive type light sensitive compositions, o-quinone diazide type light sensitive materials are often used.

Positive type light sensitive planographic printing plates are produced by coating an o-quinone diazide type light sensitive material, alone or in combination with appropriate additives, on a support such as a metal, plastic, or the like. On exposing this light sensitive printing plate to active rays through a transparent positive, the o-qunione diazide type light sensitive material of the exposed areas decomposes and becomes alkali soluble, and thus it is easily removed with an aqueous alkali solution, thereby providing a positive image.

In this case, where a support with a surface previously treated to render the same hydrophilic is used, the areas removed by an aqueous alkali solution expose the hydrophilic layer, which will receive water and repel ink. On the other hand, the areas remaining as an image are oleophilic and accept ink. As negative type light sensitive compositions, diazonium salts, azide compounds, or photopolymerizable compounds are often used. These light sensitive materials are coated, alone or in combination with appropriate additives, on a support.

In this case, where a support with a surface previously treated to render the same hydrophilic is used, unexposed areas are removed with a developer, uncovering the hydrophilic layer which will receive water and repel ink. On the other hand, the areas which have hardened upon exposure to light and remain as an image at development are oleophilic and receive ink.

When printing is effected after mounting the above planographic printing plate on an offset printing machine, commercially acceptable copies are obtained. With these printing plates, it is possible to produce several ten thousand prints by appropriately selecting the support and the light sensitive layer to be coated on the support. In particular, the use as the support of an aluminum plate subjected to sand-graining and anodic oxidation provides up to 100,000 copies.

However, it is sometimes desired that more than 100,000 copies be obtained using one printing plate.

It has been known in the lithographic art to increase press life capabilities of offset plate systems by up to tenfold when said plates are subjected to elevated heating after exposure and development. Crosslinking of the polymeric image areas occurs under heating resulting in complete solvent insolubility, increased abrasion resistance with the net result being vastly increased press life.

This heating is generally called a burning-in is described in detail in British Pat. Nos. 1,151,199 and 1,154,749 and U.S. Pat. No. 4,063,507.

The application of a burning-in makes it possible to increase the number of copies obtained with one printing plate several times as many as in the case of no burning-in being applied.

A characteristic side effect of the heating step is alteration of the aluminum substrate from a hydrophilic surface to one of an oleophilic type. It is believed that aluminum oxides present at the interface undergo complex rearrangements catalyzed by high temperature environments, thus resulting in a shift of the hydrophilic/hydrophobic balance.

With printing plates produced by conventional plate-making methods, when special printing inks containing many components capable of dissolving the image on the printing plate, such as an ultraviolet ray curable ink, a low temperature drying ink, etc., are used, the image areas of the printing plate are vigorously dissolved by these inks, resulting in a marked reduction in press life as compared to the case in which an ordinary ink is used. However, the application of a burning-in makes it possible to obtain a sufficient number of copies, even using the above special printing inks, because the solvent resistance of the image areas is markedly increased.

However, when the burning-in is applied, the non-image areas of the printing plate which are hydrophilic prior to the burning-in (i.e., areas where the hydrophilic surface of the support is exposed by development) lose their hydrophilicity and tend to receive printing ink, thereby causing contamination at the background of printed matter (background contamination). No burning-in effect, however, can be obtained unless heating is applied to the extent that the above background contamination takes place.

To negate or reverse the hydrophobic effect created by the heating step, various additional processing steps have been introduced during the overall processing procedure by various plate manufacturers. Claims of post-treatment steps as redeveloping, plate cleaners, plate conditioners, etc., have been suggested for the above. Additionally, pre-baking processing procedures have been recommended to avoid aluminum oxide reactivity.

These steps consist of applying water-soluble polymers, such as polyvinyl alcohol or gums such as gum arabic or synthetic gums to the developed plate prior to burning-in. Unfortunately, these water-soluble constituents although hydrophilic initially, undergo chemical change under elevated temperature themselves which nullify their desired intent.

After the burning-in, therefore, it had been required that a surface smoothening treatment to restore hydrophilicity by cleaning the non-image areas be applied.

This surface smoothening treatment is achieved by eroding the metal surface of the support with an aqueous alkali or acid solution, thereby exposing a fresh, clean surface. The alkali or acid used is selected from those compounds capable of eroding the metal surface in a short period, and fluorides such as hydrofluoric acid, hydroborofluoric acid, hydrosiliconfluoric acid, and the like are often used. These fluorides, however, are toxic, dangerous substances, and cause many pollution problems.

Moreover, since the application of the surface smoothening treatment erodes the metal surface of the support, and renders the surface easily scratchable and poorly durable to abrasion, it is likely that the non-image areas will lose the ability to accept water (water retention property), background contamination will occur, and the printing plate will not be durable to further printing.

SUMMARY OF THE INVENTION

It has now been found that aqueous solutions of certain polymeric compounds, specifically condensation products of alkylaryl sulfonic acid or their sodium salts preserve the hydrophilic properties of the aluminum interface when applied prior to the baking step, so that no chemical treatment of the plate is required after the burning-in procedure. These compounds form adequate film forming layers so as to prevent oxygen from entering the aluminum surface during the elevated temperature environment, thus inhibiting complex oxide rearrangements. Additionally, these aryl condensation polymers undergo additional crosslinking during heating which results in a higher degree to the hydrophilic quality of the non-image substrates relative to the unheated plate. These melamine and/or urea condensation products of alkyl-aryl sulfonates minimize the post-heating steps to a conventional gumming procedure, one that is used on non-heated offset printing plates.

It is therefore, an object of the present invention to achieve the benefit of elongated press run capability from a printing plate by means of a burning-in treatment whereby no subsequent chemical processing is required.

It is another object of the present invention to prevent background contamination caused by a burning-in which otherwise renders such background oleophilic.

These and other objects of the present invention will be in part discussed and in part apparent upon a consideration of the detailed description of the preferred embodiment.

DETAILED DESCRIPTION OF THE PREFERRED EMBODIMENT

As heretofore mentioned, the instant invention teaches a method of producing an extremely long running lithographic printing plate by means of applying an aqueous solution of certain condensed aryl sulfonic acids to the surface of an exposed and developed plate with a subsequent burning-in treatment.

The compositions of the instant invention include:

The naphthalene sulfonates in which two or more naphthalene nuclei are joined by alkylene groups. The prototype of this class is dinaphthylmethanemonosulfonic acid, the disulfonic acid having a formula as follows:

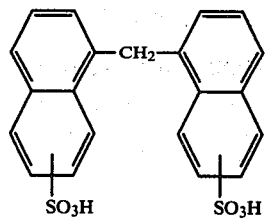

Products of this class are of indefinite composition. They may be manufactured by heating naphthalene, formaldehyde, and sulfuric acid together, or by treating naphthalene sulfonic acids with formaldehyde. Thus three or more naphthalene nuclei may be joined together by alkylene groups to yield a condensation polymer. Lower alkylated naphthalenes may also be used in the reaction. An example is monoisopropylnaphthalene. In place of naphthalene, other aromatic hydrocarbons may be employed such as benzene, diphenyl, anthracene, phenanthrene, fluorene, etc or homologues or derivatives thereof. The salts of the foregoing acids, such as the sodium salts possess similar properties. The production of dispersing agents of this type is described in detail in the literature and in prior art patents including U.S. Pat. No. 2,802,845 and representative compounds are available in the trade under the trademarks Tamol, Leukanol and Daxad.

Particularly useful for the instant invention are the sodium salts of condensed naphthalene sulfonic acids known as Tamol SN and Tamol N Micro which are available commercially from Rohm and Haas.

In practice these compounds can be applied to plates manually or by automatic processing machinery in concentrations of from 0.1% to 40%, preferably 0.5% to 15% and most preferably 0.8% to 5%.

In a typical embodiment, the pre-treating agent of the present invention is merely coated on a printing plate at room temperature and at atmosphere pressure, and then dried. No substantial detrimental influence is exerted on the successful practice of the present invention by varying the coating temperature drying temperature or drying time. Good results are obtained when the pre-treating agents of the present invention are coated in a dry amount of about 10 mg/m$^2$ or more; typically, the minimal amount required to obtain acceptable results would be utilized in order to lower material costs. The minimal amount required can easily be determined by one skilled in the art.

As one method of applying the burning pre-treating agent, the surface of the printing plate is rubbed with a sponge or absorbent cotton soaked with the pre-treating agent to thereby coat it thereon, or the printing palte is dipped in a tray filled with the pre-treating agent to thereby coat it thereon, or a like method can be used. Rendering the coating amount of the pretreating agent smooth by, e.g., squeegeeing after the coating thereof, provides preferred results.

The printing plate is, after drying, heated at high temperatures by the use of a burning processor (e.g., Burning Processor 1300 produced by Fuji Photo Film Co., Ltd.). The burning-in time varies depending upon the burning-in temperature, for instance, at 230 degrees C. about 12 minutes is conveniently used, at 260 degrees C. about 7 minutes is conveniently used; generally, the higher the temperature, the shorter the time which is required. Typically, temperatures of about 180 degrees C. to about 350 degrees C are utilized. Preferred heating temperatures and times are 200 degrees C. to 300 degrees C. and about 3 to about 20 minutes, respectively, although they vary depending upon the kind of the resin forming the image. For all practical processings, the burning-in of the present invention will be conducted at atmospheric pressure.

The following examples serve as non-limiting demonstrations of the operation of the instant invention.

EXAMPLE 1

A positive type lithographic printing plate was produced by coating a degreased, grained and anodized sheet of Alcoa grade 1100 aluminum with a photosensitive composition comprising a 1 to 1 mixture of a cresol formaldehyde resin with the condensation product of naphthoquinone-1,2-(diazide 2)-5 sulfonyl chloride with a pyrogallol acetone resin. This plate was then exposed and developed by a means well known in the art. After washing and drying the thusly produced plate was coated with a 5% aqueous solution of Tamol SN, dried and heated for 5 minutes at 250 degrees C. in a Polyfuser (TM) available from Polychrome Corporation, Yonkers, New York. This plate was then mounted on an offset press and reproduced 1,000,000 commercially acceptable copies.

EXAMPLE 2

Example 1 was repeated except the post development treatment as taught by the present invention was omitted. Only 100,000 commercially acceptable copies were obtained.

While the invention has been described in detail and with reference to specific embodiments thereof, it will be apparent to one skilled in the art that various changes and modifications can be made therein without departing from the spirit and scope thereof.

What is claimed is:

1. A process for producing a lithographic printing plate comprising exposing and developing a light-sensitive printing plate; coating the exposed and developed surface of said plate with an aqueous solution of a compound selected from the group consisting of condensed aryl sulfonates or the metal salts thereof; drying said coating and then subjecting said treated plate to a burning-in without removal of said coating composition from said surface.

2. The process of claim 1, wherein the light-sensitive planographic plate member comprises a support of aluminum.

3. A lithographic printing plate produced by the process of claim 2.

4. The process of claim 1, therein the burning-in temperature is about 180 degrees C. to about 350 degrees C.

5. The process of claim 4, wherein the burning-in is conducted in a period of from 3 to 20 minutes.

6. The process of claim 1 wherein the light-sensitive printing plate comprises an o-quinone diazide type light-sensitive material.

7. The process of claim 1 wherein the light-sensitive printing plate comprises a photosensitive composition selected from the group consisting of diazonium salts, azide compounds and photopolymerizable compounds.

8. The process of claim 1 wherein the condensed aryl sulfonate is the reaction product of naphthalene, formaldehyde and sulfuric acid.

9. The process of claim 1 wherein the condensed aryl sulfonate is the sodium salt of the reaction product of naphthalene, formaldehyde and sulfuric acid.

10. The lithographic printing plate produced by the process of claim 9.

* * * * *